(12) United States Patent
Fukuda et al.

(10) Patent No.: US 8,503,595 B2
(45) Date of Patent: Aug. 6, 2013

(54) DATA JUDGMENT/PHASE COMPARISON CIRCUIT

(75) Inventors: Koji Fukuda, Chofu (JP); Hiroki Yamashita, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/255,902

(22) PCT Filed: Sep. 29, 2009

(86) PCT No.: PCT/JP2009/066936
§ 371 (c)(1),
(2), (4) Date: Jan. 30, 2012

(87) PCT Pub. No.: WO2011/039835
PCT Pub. Date: Apr. 7, 2011

(65) Prior Publication Data
US 2012/0133394 A1   May 31, 2012

(51) Int. Cl.
*H03K 5/26* (2006.01)

(52) U.S. Cl.
USPC ........... 375/375; 375/316; 375/327; 375/354; 375/371; 375/376

(58) Field of Classification Search
USPC .................................. 375/316–352, 354–376
See application file for complete search history.

(56) References Cited

U.S. PATENT DOCUMENTS

| 4,689,577 | A | 8/1987 | Vreeken et al. |
| 6,314,151 | B1 | 11/2001 | Fukaishi |
| 6,421,404 | B1 | 7/2002 | Nakamura |
| 2004/0091064 | A1* | 5/2004 | Cao et al. ................. 375/376 |
| 2004/0114632 | A1 | 6/2004 | Yuuki et al. |
| 2008/0112522 | A1* | 5/2008 | Fukuda et al. ............ 375/371 |

FOREIGN PATENT DOCUMENTS

| JP | 60-256227 A | 12/1985 |
| JP | 11-112335 A | 4/1999 |
| JP | 11-355133 A | 12/1999 |
| JP | 2004-180188 A | 6/2004 |

OTHER PUBLICATIONS

J.D.H. Alexander, "Clock Recovery From Random Binary Data", Electronics Letters, vol. 11, Oct. 1975, pp. 541-542.

* cited by examiner

*Primary Examiner* — Shuwang Liu
*Assistant Examiner* — Ross Varndell
(74) *Attorney, Agent, or Firm* — Miles & Stockbridge P.C.

(57) ABSTRACT

The invention relates to a clock generation circuit and a signal reproduction circuit including the clock generation circuit, and, more particularly, the invention provides a data judgment/phase comparison circuit capable of performing both of data judgment and phase comparison by a single-phase clock, and provides a CDR (Clock Data Recovery) circuit including the data judgment/phase comparison circuit. The same data and clock are inputted to two data judging units C_GOOD and C_BAD each having a different data determination period (setup/hold time) required for correctly judging a data, and an output of the data judging unit C_GOOD having a shorter required data determination period is taken as a data output of the data judgment/phase comparison circuit. When the outputs of both of the data judging units are different from each other, a signal Early indicating that a clock phase is too early or a signal Late indicating that the clock phase is too late is outputted. Depending on a relation among data outputs of total three symbols obtained by combining a symbol and symbols previous and subsequent thereto, it is selected that either the Early or the Late is to be outputted by a decision logic EL_LOGIC.

11 Claims, 12 Drawing Sheets

IT IS UNCLEAR THAT CLOCK IS EITHER
TOO EARLY OR TOO LATE

DATA JUDGMENT/PHASE COMPARISON CIRCUIT

TECHNICAL FIELD

The present invention relates to a clock generation circuit and a signal reproduction circuit including the clock generation circuit, and, more particularly, the present invention relates to a data judgment/phase comparison circuit capable of performing both of data judgment and phase comparison with a single-phase clock, and a CDR (Clock Data Recovery) circuit including the data judgment/phase comparison circuit.

BACKGROUND ART

FIG. 1 shows a signal reproduction circuit studied as a premise of the present invention. The signal reproduction circuit CDR_C shown in FIG. 1 is a structure example similar to that of Patent Document 1. The signal reproduction circuit CDR_C is configured with: a data judgment/phase comparison circuit DD/PD; an averaging circuit AV; a phase pointer control circuit PCON; a phase interpolation circuit PI; and an N-phase clock generation circuit NPG.

The data judgment/phase comparison circuit DD/PD judges a data input Din in synchronization with a clock phase for data acquisition among n-phase clocks CLKn, and outputs the judgment result to a data output Dout. Simultaneously, the data judgment/phase comparison circuit DD/PD compares phases of the data input Din with the n-phase clocks CLKn with using a plurality of clock phases of the n-phase clocks CLKn, and outputs an Early signal when the phase of the n-phase clock CLKn is earlier than that of the data input Din and a Late signal when the phase of the n-phase clock CLKn is later than that of the data input Din.

The averaging circuit AV calculates an average shift in phase between the n-phase clock CLKn and the data input Din from a result of the phase comparison outputted from the data judgment/phase comparison circuit DD/PD, that is, from calculation of Early and Late signals for a certain period. As a result, when the phases of the n-phase clocks CLKn are later than the phase of the data input Din on average, an Up signal is outputted, and, when the phases of the n-phase clocks CLKn are earlier than the phase of the data input Din on average, a Down signal is outputted. A processing by the averaging circuit AV is substantially equivalent to a processing of using a low-pass filter, and an analog low-pass filter may be used in place of the averaging circuit AV.

The phase pointer control circuit PCON outputs a phase control signal Sph for controlling an output phase of the phase interpolation circuit PI based on the above-described Up signal and the Down signal. When the averaging circuit AV outputs the Up signal, it controls so that a phase of an output clock of the phase interpolation circuit is advanced. Conversely, when the averaging circuit AV outputs the Down signal, it controls so that the phase of the output clock of the phase interpolation circuit is delayed.

The phase interpolation circuit PI is typically operated by changing a phase of a reference clock CLKref inputted from an outside based on the phase control signal Sph. However, an essential function of the phase interpolation circuit PI is to change a phase of a clock CLK outputted based on the phase control signal Sph. For example, a method without using the reference clock can be also considered such that a source oscillator capable of changing the output phase based on the phase control signal Sph is embedded in the phase interpolation circuit PI.

The N-phase clock generation circuit NPG is a circuit for generating n-phase clocks from the single-phase clock CLK outputted by the phase interpolation circuit PI, which is required at the data judgment/phase comparison circuit DD/PD. At this time, a specific clock phase among the n-phase clocks is outputted to an outside of the signal reproduction circuit CDR_C as a reproduction clock CLKout.

According to the signal reproduction circuit CDR_C of FIG. 1, a clock for data acquisition among the n-phase clocks CLKn always follows the phase of the data input Din, so that a correct data judgment can be achieved.

Each of FIGS. 2A and 2B shows a structure example of the data judgment/phase comparison circuit DD/PD studied as a premise of the present invention. However, these figures show only an essential part of the entire circuit, and a retiming circuit among signals and others are omitted.

FIG. 2A shows a structure of a data judgment/phase comparison circuit DD/PD of an Alexander's method disclosed in Non-Patent Document 1. To the data judgment/phase comparison circuit DD/PD shown in FIG. 2A, a data input Din and two-phase clocks clkD and clkE which are shifted from each other by a half one symbol period are inputted, and the circuit outputs a data output Dout and phase comparison signals Early and Late. At this time, a result obtained from the two-phase clocks by judging the data input Din in synchronization with the clkD is outputted as the Dout.

FIG. 2B shows a structure of a data judgment/phase comparison circuit DD/PD of an eye tracking method disclosed in Patent Document 1. To the data judgment/phase comparison circuit DD/PD shown in FIG. 2B, the data input Din and three-phase clocks clkD, clkE, and clkL shifted from each other by a quarter time the one symbol period are inputted, and the circuit outputs a data output Dout and phase comparison signals Early and Late. At this time, a result obtained from the three-phase clocks by judging the data input Din in synchronization with the clkD is outputted as the Dout.

PRIOR ART DOCUMENTS

Patent Document

Patent Document 1: Japanese Patent Application Laid-Open Publication No. 2004-180188

Non-Patent Document

Non-Patent Document 1: J. D. H. Alexander, "Clock Recovery from Random Binary Data", Electronics Letters, Vol. 11, October 1975, p. 541 to 542

DISCLOSURE OF THE INVENTION

Problems to be Solved by the Invention

In the data judgment/phase comparison circuits DD/PD shown in FIGS. 2A and 2B, in addition to the clock clkD required for the data output Dout, a clock whose phase is different from that of the clkD is required for outputting the phase comparison signals Early and Late. Therefore, for the operation of the data judgment/phase comparison circuits DD/PD, not a single-phase clock but two-phase or three-phase clocks CLKn are required. Therefore, in the signal reproduction circuit CDR_C shown in FIG. 1, the two-phase or three-phase clocks CLKn are generated by the N-phase clock generation circuit NPG from the single-phase clock CLK outputted by the phase interpolation circuit PI.

However, generally, the increase in the number of clock phases directly leads to increase in a circuit size and power consumption. More particularly, the data judgment/phase comparison circuit DD/PD requires a clock with a high frequency for high-speed data judgment and phase comparison for the data input Din. Therefore, the circuit size and power consumption required for generation and distribution of multiphase clocks are increased. Further, in recent years, the frequencies of the data input Din and the clocks have been further increased in order to improve a transmission speed, and therefore, the circuit size and power consumption used for the generation and distribution of the multiphase clocks have occupied considerable parts of the circuit size and power consumption of the entire signal reproduction circuit.

The present invention has been made in consideration of such a matter, and one of preferred aims of the present invention is to provide a data judgment/phase comparison circuit capable of both of data judgment and phase comparison with only a single-phase clock and without using multiphase clocks. The above and other preferred aims and novel characteristics of the present invention will be apparent from the description of the present specification and the accompanying drawings.

Means for Solving the Problems

The typical ones of the inventions disclosed in the present application will be briefly described as follows.

A data judgment/phase comparison circuit according to the present embodiment includes: two data judgment circuits operated in synchronization with a single clock CLK; and a logic circuit formed of a flip flop, a logical AND, and an exclusive-OR, the logic circuit being connected in a latter stage of the data judgment circuits. The two data judgment circuits operated in synchronization with the single clock CLK have different data determination periods (required setup time and required hold time) from each other which are required for judging a correct data.

The data output Dout of the data judgment/phase comparison circuit is connected to an output of the data judgment circuit having a shorter data determination period (as a sum of the required setup time and the required hold time) required for correctly judging the data. As long as the signal reproduction circuit is locked, it can be considered that the data output Dout outputs the substantially correct data.

The phase comparison signals Early and Late are outputted as follows. If the two data judgment circuits having different data determination periods (as the sum of the required setup time and the required hold time) from each other which are required for correctly judging the data output the same judgment result, neither Early nor Late is outputted. In this case, since the data judgment circuit having a longer required data determination period also correctly judges the data, it is considered that the data input Din has sufficient determination time for the clock CLK.

On the other hand, if the two data judgment circuits output different judgment results, the data determination period for the CLK of the input data Din is shorter than the data determination period required for the data judgment circuit having the longer required data determination period, and the data judgment circuit having the longer required data determination period have made an error judgment, that is, it is considered that an edge of the data input Din is closer to the CLK. In this case, by considering a data at one previous symbol to a symbol (a focus symbol) and a data at one subsequent symbol thereto, the phase of the clock can be judged as either too early (Early) or too late (Late).

More specifically, as the data judgment result having the shorter required data determination period, if the focus symbol and the one previous symbol have the same result, the determination is made as the Late, and, if the focus symbol and the one subsequent symbol have the same result, the determination is made as the Early. A procedure of determining that the phase of the clock is too early (Early) or too late (Late) will be further described in detail in description of embodiments.

When this structure is used, by inputting only the data input Din and the single (single-phase) clock CLK, not only the data judgment output Dout but also the phase comparison outputs Early and Late can be outputted. Therefore, as compared with the case of using multiphase clocks as described above, the circuit size and power consumption can be reduced.

Effects of the Invention

The effects obtained by typical aspects of the present invention will be briefly described such that a data judgment/phase comparison circuit can be operated by only a single-phase clock, so that a the circuit size and power consumption required for generation and distribution of multiphase clock signals can be reduced.

BRIEF DESCRIPTIONS OF THE DRAWINGS

BEST MODE FOR CARRYING OUT THE INVENTION

Figure 1:
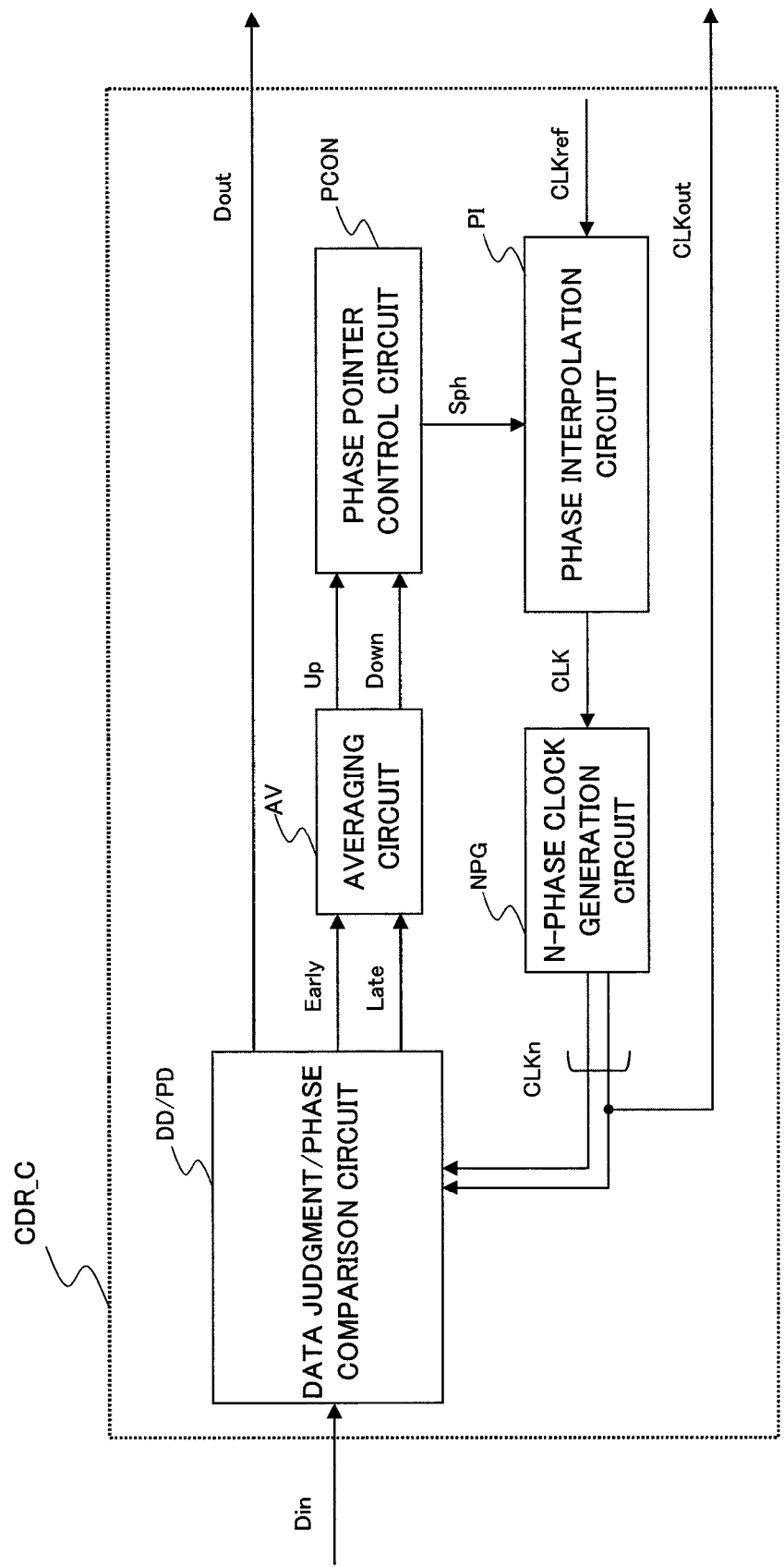
FIG. 1 is a diagram showing a signal reproduction circuit studied as a premise of the present invention.

In each embodiment described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in each embodiment described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, a circuit element configuring each functional block of each embodiment is formed on a semiconductor substrate made of single crystal silicon or others by an integrated circuit technique such as an publicly-known CMOS (complementary MOS transistor) although not particularly limited. Note that, in the embodiments, as one example of a MISFET (Metal Insulator Semiconductor Field Effect Transistor), a MOS (Metal Oxide Semiconductor) transistor is used. In the drawings, by attaching a circle symbol to a gate in a P-channel type MOS transistor (PMOS transistor), the transistor is distinguished from an N-channel type MOS transistor (NMOS transistor). Although, in the drawings, a connection of a substrate potential of the MOS transistor is not particularly shown, a method of the connection is not particularly limited as long as within a scope in which the MOS transistor can be normally operated.

Hereinafter, embodiments of the present invention will be described in detail based no the drawings. Note that the same components are denoted by the same reference symbols throughout the drawings for describing the embodiments, and the repetitive description thereof will be omitted.

First Embodiment

Figure 3:
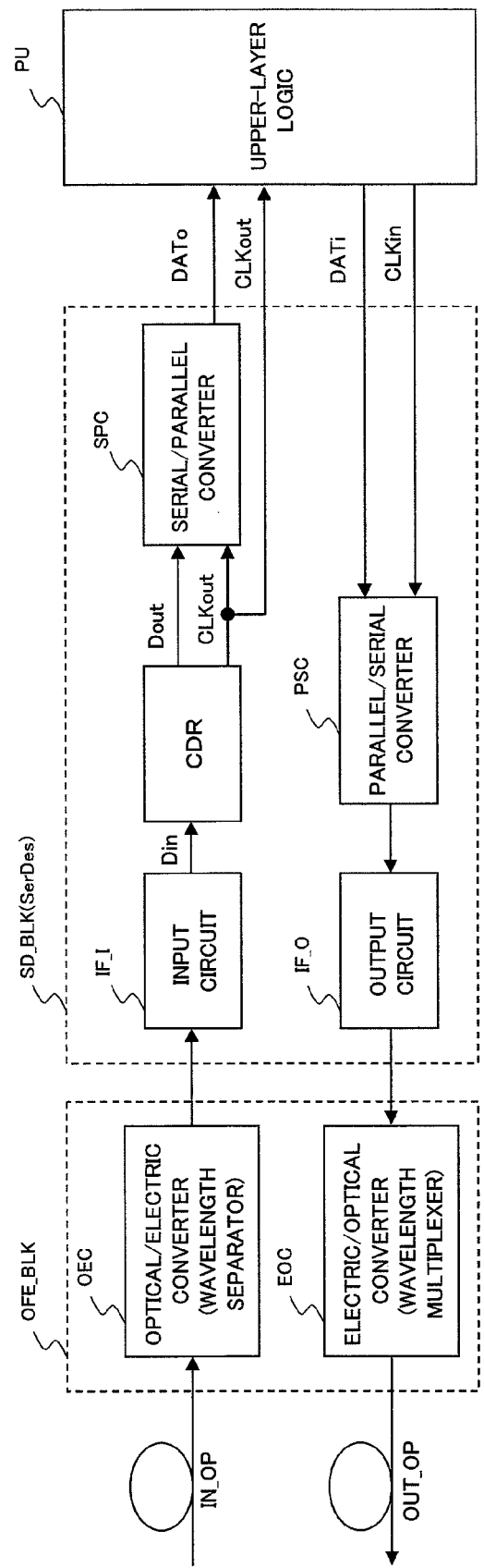
FIG. 3 is a block diagram showing a structure example of an optical communication system according to a first embodiment of the present invention.

FIG. 3 is a block diagram of a structure example of an optical communication system including a signal reproduction circuit according to a first embodiment of the present invention. The optical communication system shown in FIG. 3 includes: a photoelectric conversion block OFE_BLK; a serial/parallel conversion block (SerDes: SERializer/DESerializer) SD_BLK; and an upper-layer logical block PU. The OFE_BLK includes, for example: an optical/electric conversion circuit OEC for converting an optical input data signal IN_OP to an electric signal via, for example, a photodiode or others; and an electric/optical conversion circuit EOC for converting an electric signal to an optical output data signal OUT_OP via a semiconductor laser or others.

As input-based circuits, the SD_BLK includes: an input circuit IF_I for amplifying a minimal data signal from the OEC into a data signal at a predetermined voltage level; a signal reproduction circuit CDR for reproducing a data signal Dout and a clock signal CLKout from a data signal Din as an output of the input circuit; and a serial/parallel conversion circuit SPC for converting the Dout which becomes a serial data into a parallel data signal DATo by using the CLKout. The upper-layer logical block PU receives these CLKout and DATo and performs a predetermined information processing. Also, as output-based circuits, the SD_BLK includes: a parallel/serial conversion circuit PSC for converting a parallel data signal DATi from the PU into a serial data signal by using a clock signal CLKin from the PU; and an output circuit IF_O for driving the electric/optical conversion circuit EOC by a predetermined electric signal based on the serial data signal.

Figure 2A:
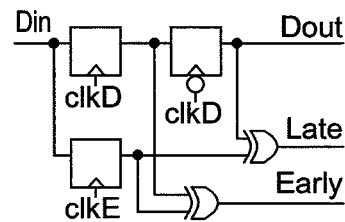
FIG. 2A is a diagram showing a data judgment/phase comparison circuit disclosed in Non-Patent Document 1 studied as a premise of the present invention.
Figure 2A:
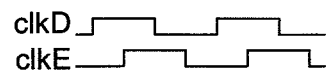
Figure 2B:
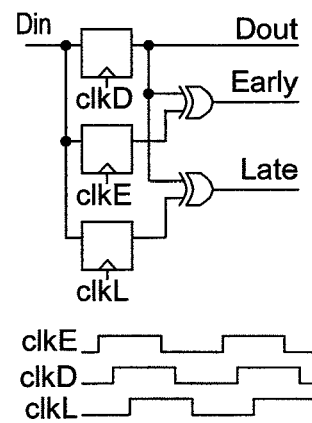
FIG. 2B is a diagram showing a data judgment/phase comparison circuit disclosed in Patent Document 1 studied as a premise of the present invention.
Figure 2B:
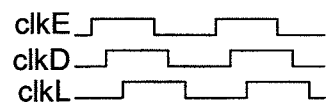

In such an optical communication system, communications over several tens of Gbps is performed, and therefore, a frequency of the clock signal in the signal reproduction circuit CDR is extremely high. Therefore, as described above, in the methods of the data judgment and the phase comparison by using multiphase clocks shown in FIGS. 2A and 2B, the circuit size and power consumption required for generation and distribution of multiphase clocks occupy a large part of the circuit size and power consumption of the entire signal reproduction circuit CDR. Thus, as described later, by using the data judgment/phase comparison circuit according to the present embodiment which can be operated by a single-phase clock, the circuit size and power consumption can be reduced.

Figure 4:
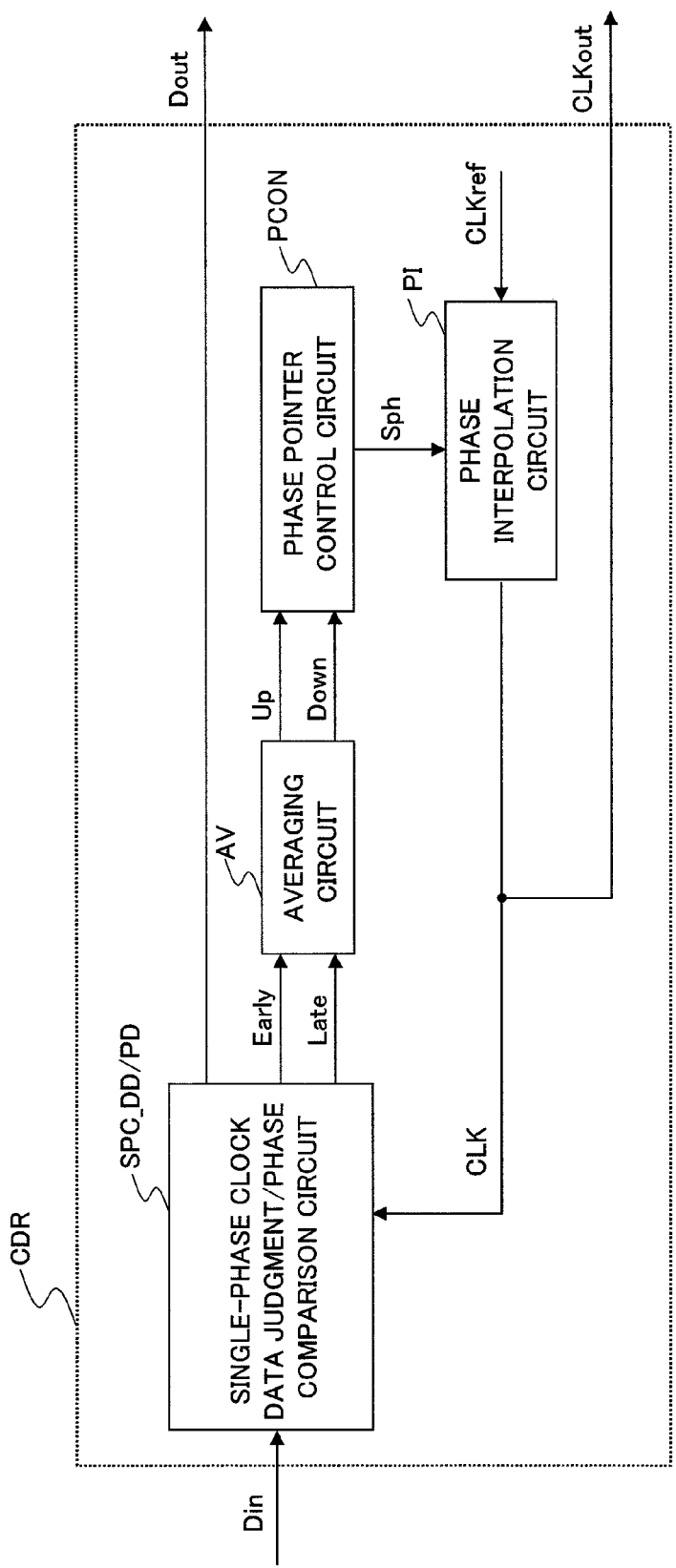
FIG. 4 is a diagram showing a single-phase clock phase comparison circuit according to the first embodiment.

FIG. 4 is a block diagram of a structure example of the signal reproduction circuit CDR in the optical communication system of FIG. 3. The signal reproduction circuit CDR shown in FIG. 4 includes: a single-phase clock data judgment/phase comparison circuit SPC_DD/PD; an averaging circuit AV; a phase pointer control circuit PCON; and a phase interpolation circuit PI. The signal reproduction circuit CDR shown in FIG. 4 has a feature in which the N-phase clock generation circuit NPG is eliminated as compared with the signal reproduction circuit CDR_C depicted in FIG. 1. That is, to the single-phase clock data judgment/phase comparison circuit SPC_DD/PD, the data input Din and the single-phase clock CLK are inputted.

The single-phase clock data judgment/phase comparison circuit SPC_DD/PD judges the data input Din in synchronization with the single-phase clock CLK, and outputs the judgment result to the data output Dout. Simultaneously, the phases of the data input Din and the clock CLK are compared with each other, and outputs the Early signal if the phase of the clock CLK is earlier than that of the data input Din, and outputs the Late signal if the phase of the clock CLK is later than that of the data input Din.

The averaging circuit AV calculates an average shift in phase between the clock CLK and the data input Din from the result of the phase comparison outputted from the single-phase clock data judgment/phase comparison circuit SPC_DD/PD, that is, from the calculation of the Early and Late signals for a certain period. As a result, when the phases of the clocks CLK are later than the phase of the data input Din on average, the Up signal is outputted. If the phases of the clocks CLK are earlier than the phase of the data input Din on average, the Down signal is outputted. The processing by the averaging circuit AV is substantially equivalent to a processing of using a low-pass filter, and an analog low-pass filter can be also used instead of the averaging circuit AV.

The phase pointer control circuit PCON outputs the phase control signal Sph for controlling an output phase of the phase interpolation circuit PI based on the above-described Up signal and the Down signal. If the averaging circuit AV outputs the Up signal, it controls so that the phase of the output clock of the phase interpolation circuit is advanced. Conversely, if the averaging circuit AV outputs the Down signal, it controls so that the phase of the output clock of the phase interpolation circuit is delayed.

The phase interpolation circuit PI is typically operated by changing the phase of the reference clock CLKref inputted from an outside based on the phase control signal Sph. This circuit can be achieved by publicly-known means such as a phase interpolation circuit which uses four-phase clocks whose phases are shifted from each other by 90 degrees as the reference clock and adds these four-phase clocks multiplied by an appropriate coefficient.

Also, an essential function of the phase interpolation circuit PI is to change the phase of the clock CLK outputted based on the phase control signal Sph. For example, a method without using the reference clock is also considered, in which a source oscillator capable of changing the output phase based on the phase control signal Sph is embedded in the phase interpolation circuit PI. In this case, publicly-known means can be used, such as a structure in which the phase of the output clock CLK is directly changed based on the phase control signal Sph or a structure in which the phase of the output clock CLK is indirectly changed by changing a frequency of the output clock CLK based on the phase control signal Sph.

Figure 5A:
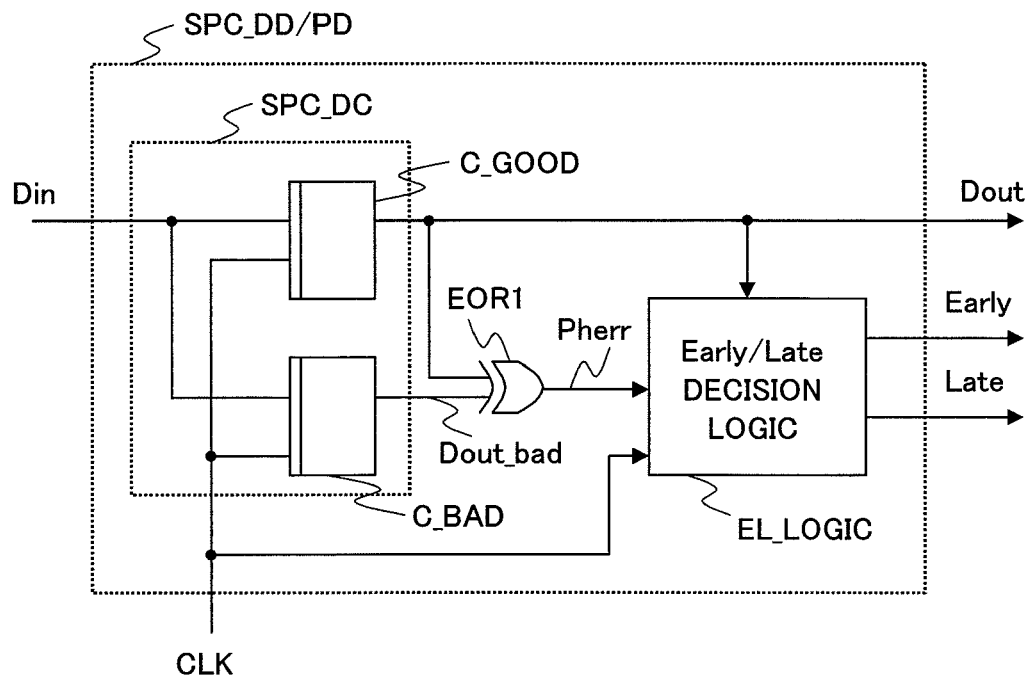
FIG. 5A is a block diagram showing a detailed structure of a single-phase clock data judgment/phase comparison circuit in FIG. 4.

FIG. 5A is a diagram showing a detailed structure example of the single-phase clock data judgment/phase comparison circuit SPC_DD/PD in FIG. 4. The single-phase clock data judgment/phase comparison circuit SPC_DD/PD shown in FIG. 5A includes: a clock synchronous data judging unit C_GOOD having a short data determination period (as a sum of a required setup time and a required hold time) for judging a correct data, that is, having a good performance; a clock synchronous data judging unit C_BAD having a long data determination period (as the sum of the required setup time and the required hold time) required for correctly judging the data, that is, having a bad performance; an exclusive-OR circuit EOR1 for outputting the exclusive-OR of outputs of these two clock synchronous data judging units; and an Early/Late decision logic EL_LOGIC.

The clock synchronous data judging unit C_GOOD having the short data determination period (as the sum of the required setup time and the required hold time) required for correctly judging the data, that is, having the good performance, outputs a result obtained by judging the data input Din in synchronization with the clock CLK as the data output Dout. The clock synchronous data judging unit C_BAD having the long data determination period (as the sum of the required setup time and the required hold time) required for correctly judging the data, that is, having the bad performance, outputs a result obtained by judging the data input Din in synchronization with the clock CLK as Dout_bad. That is, each of the two data judging units C_GOOD and C_BAD outputs the result obtained by judging the same data input Din in synchronization with the same clock CLK. However, since the two data judging units each have the different data determination periods (as the sum of the required setup time and the required hold time) required for correctly judging the data, they may output a different data judgment result depending on a time relation between data transition timing and a clock edge. Here, a unit obtained by combining the clock synchronous data judging unit C_GOOD having the short data determination period (as the sum of the required setup time and the required hold time) required for correctly judging the data, that is, having the good performance, with the clock synchronous data judging unit C_BAD having the long data determination period (as the sum of the required setup time and the required hold time) required for correctly judging the data, that is, having the bad performance, is referred to as a single-phase clock dual data judging unit SPC DC.

Also, the judgment result Dout of the clock synchronous data judging unit C_GOOD having the short data determination period (as the sum of the required setup time and the required hold time) required for correctly judging the data, that is, having the good performance, is outputted as the data output Dout of the single-phase clock data judgment/phase comparison circuit SPC_DD/PD without change. However, for a purpose of matching the timing of the Early/Late decision logic EL_LOGIC described later or other purposes, an output obtained by delaying the output of the data judging unit C_GOOD by a delay circuit, a shift register with a flip-flop, or others can be outputted as the data output Dout of the single-phase clock data judgment/phase comparison circuit SPC_DD/PD.

The exclusive-OR circuit EOR1 calculates the exclusive-OR of the output Dout of the data judging unit C_GOOD and the output Dout_bad of the data judging unit C_BAD, and outputs the result as a phase error signal Pherr.

In a state that a phase adjusting mechanism of the CDR is locked, the phase of the clock CLK is controlled so that the data determination periods of the two data judging units C_GOOD and C_BAD are maximized for the data input Din. Therefore, in the state that the phase adjusting mechanism of the CDR is locked, it is considered that the clock synchronous data judging unit C_GOOD having the short data determination period (as the sum of the required setup time and the required hold time) required for correctly judging the data, that is, having the good performance, can almost always correctly judges the data. Therefore, if the output Dout of the data judging unit C_GOOD and the output Dout bad of the data judging unit C_BAD are different from each other, it is considered that the data judging unit C_GOOD has correctly judged the data and the C_BAD has erroneously judged the data. That is, it can be said that, since the edge of the data input Din comes closer to the clock CLK, the data determination period required for correctly judging the data by the C_BAD has not been able to be ensured, and, more specifically, the required setup time or the required hold time has not been able to be ensured. Therefore, the phase error signal Pherr is a precondition for outputting the phase comparison signal Early or Late by the single-phase clock data judgment/phase comparison circuit SPC DD/PD.

The Early/Late decision logic EL_LOGIC is a logic circuit to which the output Dout of the data judging unit C_GOOD with the good performance and the phase error signal Pherr are inputted, and which outputs a signal (Early) indicating that the phase of the clock CLK is too early for the data input Din and a signal (Late) indicating that the phase of the clock CLK is too late for the data input Din.

Figure 5B:
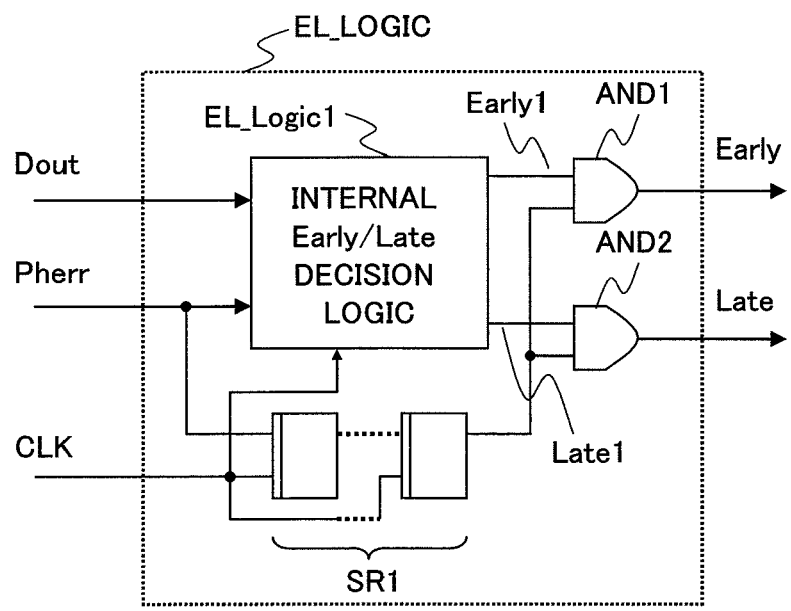
FIG. 5B is a diagram showing a detailed structure example of an Early/Late decision logic EL_LOGIC in FIG. 5A.

FIG. 5B shows a more detailed structure example of the Early/Late decision logic EL_LOGIC. The Early/Late decision logic EL_LOGIC depicted in FIG. 5B includes: an internal Early/Late decision logic EL_Logic1 for calculating an Early1 and a Late1 from the data output Dout of the data judging unit C_GOOD with the good performance and the phase error signal Pherr; a shift register SR for delaying the phase error signal Pherr by a required clock cycle; a logical AND circuit AND1 for calculating the logical AND of the Early1 and the phase error signal Pherr; and a logical AND circuit AND2 for calculating the logical AND of the Late1 and the phase error signal Pherr.

As described above, the phase error signal Pherr is the precondition for outputting the phase comparison signal Early or Late by the single-phase clock data judgment/phase comparison circuit SPC_DD/PD. Therefore, logically, as an output for the Early and an output for the Late in the Early/Late decision logic EL_LOGIC, the logical AND circuit with the phase error signal Pherr is inserted. At this time, it is required to delay the phase error signal Pherr by a delay in the internal Early/Late decision logic EL_Logic1, and therefore, the shift register SR1 is inserted. A specific delay amount of the shift register SR1 is determined in accordance with a delay amount caused in the internal Early/Late decision logic EL_Logic1, and can take various values depending on details of implementation of the internal Early/Late decision logic EL_Logic1. Also, the logical AND circuit AND1 for calculating the logical AND of the Early1 and the phase error signal Pherr and the logical AND circuit AND2 for calculating the logical AND of the Late1 and the phase error signal Pherr are logically represented by logical AND circuits inserted at a final stage of the EARLY/Late decision logic EL_LOGIC. However, a practical circuit is subjected to equivalent logical transformation such as logic compression, and, as a result, it may be considered that the logical AND circuit may not be necessarily inserted at the final stage.

Figure 6A:
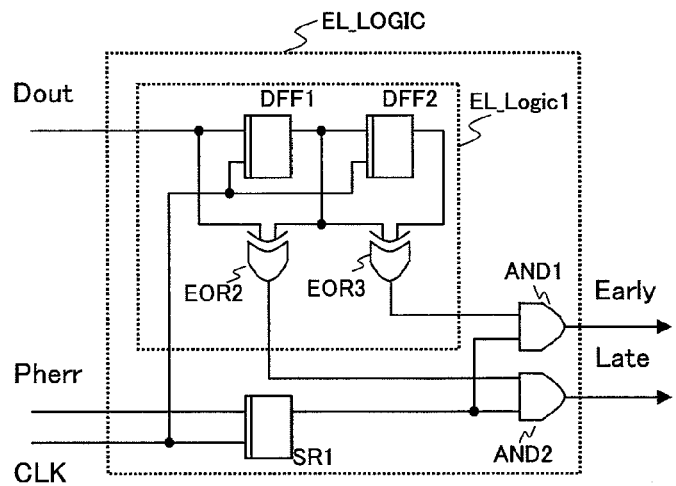
FIG. 6A is a diagram showing a structure example of an Early/Late decision logic EL_LOGIC further detailing a part of an internal Early/Late decision logic EL_Logic 1 in FIG. 5B.
Figure 6B:
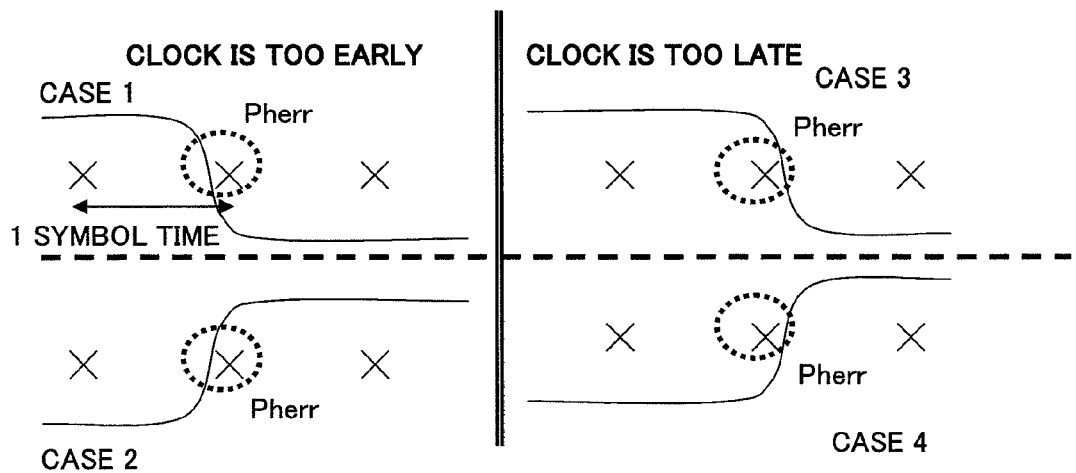
FIG. 6B is a waveform diagram showing an operational principle of the Early/Late decision logic EL_LOGIC of FIG. 6A.

FIG. 6A shows a structure example of the entire Early/Late decision logic EL_LOGIC including the detailed structure of the internal Early/Late decision logic EL_Logic1 in FIG. 5B. Also, FIG. 6B shows a waveform diagram expressing an operational principle of FIG. 6A. FIG. 6B shows a four-type waveform diagram, and each waveform is shown with taking time in a horizontal axis and the data input Din in a vertical axis. A cross mark in the figure represents a judgment position of the clock synchronous data judging unit, and is arranged for every one symbol time. The clock synchronous data judging unit C_GOOD having the short data determination period (as the sum of the required setup time and the required hold time) required for correctly judging the data, that is, having the good performance, and the clock synchronous data judging unit C_BAD having the long data determination period (as the sum of the required setup time and the required hold time) required for correctly judging the data, that is, having the bad performance, judge the same data input Din in synchronization with the same clock CLK. In FIG. 6B, one cross mark represents a judgment position for both of the C_GOOD and the C_BAD. In FIG. 6B, a case 1 and a case 2 correspond to the case that the phase of the clock CLK is too late because a transition of the data input Din is positioned immediately before a center judgment position. Conversely, a case 3 and a case 4 correspond to the case that the phase of the clock CLK is too early because the transition of the data input Din is positioned immediately after the central judgment position. In all cases of the case 1 to the case 4, the transition of the data input Din is positioned too close to the center judgment position, and therefore, there is a possibility of the erroneous judgment by the clock synchronous data judging unit C_BAD having the long data determination period (as the sum of the required setup time and the required hold time) required for correctly judging the data, that is, having the bad performance. On the other hand, it is considered that the clock synchronous data judging unit C_GOOD having the short data determination period (as the sum of the required setup time and the required hold time) required for correctly judging the data, that is, having the good performance, always correctly judges the data. As a result, the judgment results of the two clock synchronous data judging units C_GOOD and C_BAD are different from each other, and the phase error signal Pherr is outputted. In FIG. 6B, a circle with a dotted line surrounding the cross mark indicating the judgment position indicates a possibility of outputting the phase error signal Pherr at this judgment position.

When the phase error signal Pherr is outputted, the case that the clock phase is too early, that is, the case 1 or the case 2, and the case that the clock phase is too late, that is, the case 3 or the case 4, can be discriminated from each other as follows. In the case 1 and the case 2 that the clock phase is too early, while the data input Din is different at the central judgment position where the Pherr is outputted and a judgment position at one previous symbol (on a left side) to that of the central judgment position, the data input Din is the same at the central judgment position where the Pherr is outputted and a judgment position at one subsequent symbol (on a right side) to that of the central judgment position. Conversely, in the case 3 and the case 4 that the clock phase is too late, while the data input Din is the same at the central judgment position where the Pherr is outputted and the judgment position at one previous symbol thereto (on the left side), the data input Din is different at the central judgment position where the Pherr is outputted and the judgment position at one subsequent symbol thereto (on the right side). Therefore, the case that the clock phase is too early and the case that the clock phase is too late can be discriminated from each other by calculating the exclusive OR between the data input Din at the symbol where the phase error signal Pherr is outputted, that is, the judgment result of the clock synchronous data judging unit C_GOOD having the good performance, and the data input Din at each of the previous and subsequent symbols, that is, the judgment result of clock synchronous data judging unit C_GOOD having the good performance to verify that the transition of the data input Din is caused at either the previous or subsequent symbol.

The internal Early/Late decision logic EL_Logic1 shown in FIG. 6A is a structure example of a circuit based on the above-described idea. In FIG. 6A, data outputs Dout at total three symbols are stored by delaying the data output Dout, that is, the output of the clock synchronous data judging unit C_GOOD having the good performance by two D-type flip flops DFF1 and DFF2. when the phase error signal Pherr is inputted, the signal (Early) indicating that the phase of the clock CLK is too early for the data input Din and the signal (Late) indicating that the phase of the clock CLK is too late for the data input Din are outputted by calculating the exclusive OR among these data outputs Dout for three symbols by two exclusive-OR circuits EOR2 and EOR3. At this time, a delay is caused by one symbol in the internal Early/Late decision logic EL_Logic1, and therefore, the shift register circuit SR1 for the one symbol delay is inserted also on the phase error signal Pherr side.

As described above, by using the single-phase clock data judgment/phase comparison circuit according to the first embodiment and the signal reproduction circuit including the single-phase clock data judgment/phase comparison circuit, the required clock phases can be decreased from the conventional two or more phases to the single phase, and the circuit size and power consumption can be reduced.

Second Embodiment

In a second embodiment, the structure of the single-phase clock data judgment/phase comparison circuit is not different from that of the first embodiment shown in FIG. 5A. However, as the Early/Late decision logic, an Early/Late decision logic EL_LOGIC' of FIG. 7A is used instead of the EL_LOGIC of FIG. 6A.

As described above, when the phase error signal Pherr is outputted, by verifying that the transition of the data input Din is caused at either the previous or subsequent symbol, the case that the clock phase is too early and the case that the clock phase is too late can be discriminated from each other. However, by the judging method of the first embodiment described with reference to FIG. 6B, there is the possibility of the erroneous discrimination of the case that the clock phase is too early or the clock phase is too late. FIG. 7B shows a waveform diagram describing this situation.

In FIG. 7B, at the central judgment position and the judgment position at one subsequent symbol thereto (on the right side), the transition of the data input Din is caused immediately before or immediately after the judgment position, and therefore, there is a possibility that the judgment result of the clock synchronous data judging unit C_GOOD having the short data determination period (as the sum of the required setup time and the required hold time) required for correctly judging the data, that is, having the good performance and the judgment result of the clock synchronous data judging unit C_BAD having the long data determination period (as the sum of the required setup time and the required hold time) required for correctly judging the data, that is, having the bad performance are different from each other, in other words, there is a possibility of outputting the phase error signal Pherr. However, as shown in FIG. 7B, when the transition of the data input Din is caused before the central judgment position and the transition of the data input Din is caused after the judgment position at one subsequent symbol thereto (on the right side), it cannot be originally verified that the clock phase is too early or the clock phase is too late, and, as a result of the delay of the phase of the clock, a case that a state of FIG. 7B is caused is also possible. However, in this case, while the data outputs Dout at the central judgment position and the judgment position at one previous symbol thereto (on the left side) are different from each other, the data outputs Dout at the central judgment position and the judgment position which is positioned one symbol delay thereof (on the right side) are the same with each other, and therefore, the Early/Late decision logic EL_LOGIC having the structure shown in FIG. 6A outputs the signal (Early) indicating that the phase of the clock CLK is too early for the data input Din. As a result, the phase of the clock CLK is further delayed by the signal reproduction circuit CDR, and this is originally not a desirable operation. Conversely, the Late may be outputted in spite of the clock delay.

Figure 7A:
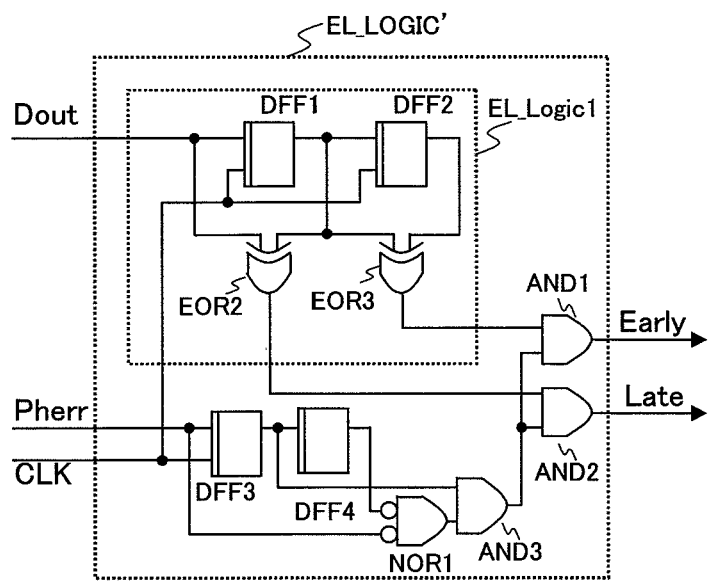
FIG. 7A is a circuit diagram of an Early/Late decision logic EL_LOGIC' adopted in a single-phase clock phase comparison circuit according to a second embodiment of the present invention.
Figure 7B:
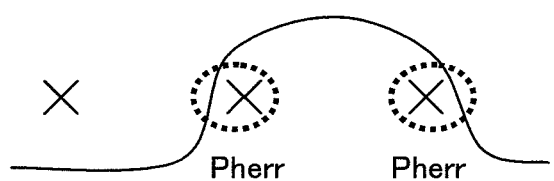
FIG. 7B is a waveform diagram describing a principle of the Early/Late decision logic EL_LOGIC' of FIG. 7A.

The Early/Late decision logic EL_LOGIC' of FIG. 7A is obtained by improving the above-described demerit of the EARLY/LATE decision logic EL_LOGIC of FIG. 6A. In FIG. 7A, the phase error signal Pherr is delayed by two D-type flip flops DFF3 and DFF4, and the phase error signals Pherr at total three symbols are stored. These phase error signals for three symbols are inputted to a negative OR circuit NOR1 and a logical AND circuit AND3. In the Early/Late decision logic EL_LOGIC' shown in FIG. 7A, when the phase error signal Pherr is outputted only at the central judgment position and the phase error signal Pherr is not outputted at the previous and subsequent symbols, that is, only in the case corresponding to the four types shown in FIG. 6B, the phase error signal Pherr is inputted to the logical AND circuits AND1 and AND2 inserted at a final stage of the Early/Late decision logic EL_LOGIC'. As a result, as shown in FIG. 7B, when the phase error signal Pherr is outputted at not only the central judgment position but also the judgment positions at previous and subsequent symbols, the Early/Late decision logic EL_LOGIC' outputs neither the Early signal nor the Late signal. Therefore, the erroneous output of the Early signal or the Late signal can be prevented.

As described above, in the single-phase clock data judgment/phase comparison circuit according to the second embodiment and the signal reproduction circuit including the single-phase clock data judgment/phase comparison circuit, the erroneous output of the phase comparison result by the phase comparator is prevented, and a reproduction error by the signal reproduction circuit is decreased.

Third Embodiment

In a third embodiment, from each component of the single-phase clock data judgment/phase comparison circuit SPC_DD/PD according to the first embodiment described with reference to FIG. 5A, the single-phase clock dual data judging unit SPC_DC is replaced by an SPC_DC' shown in FIG. 8B. FIG. 8B is a conceptual diagram showing a principle operation of the single-phase clock dual data judging unit SPC_DC' of FIG. 8A. In FIG. 8B, time is taken as a horizontal axis, and FIG. 8B shows the clock CLK, a period having a possibility of the erroneous judgment by the clock synchronous data judging unit C_GOOD having the short data determination period (as the sum of the required setup time and the required hold time) required for correctly judging the data, that is, having the good performance, and a period having a possibility of the erroneous judgment by the clock synchronous data judging unit C_BAD having the long data determination period (as the sum of the required setup time and the required hold time) required for correctly judging the data, that is, having the bad performance. Here, a period of having the possibility of the erroneous judgment by the clock synchronous data judging unit C_BAD having the bad performance while the correct judgment of the data by the clock synchronous data judging unit C_GOOD having the good performance is a period having a possibility of outputting the phase comparison signal in the data judgment/phase comparison circuit in the present invention. Among these periods, as shown in FIG. 8B, a period on a former side of a clock rising is referred to as an eye track window period 1 or TW1, and a period on a later side of the clock rising is referred to as an eye track window period 2 or TW2. When the transition of the data input Din is caused during the period of TW1, there is a possibility of outputting the Early signal. When the transition of the data input Din is caused during the period of TW2, there is a possibility of outputting the Late signal.

In order to increase the performance of the signal reproduction circuit CDR, it is required that lengths of the time widths of the TW1 and the TW2 are almost the same with each other. The signal reproduction circuit CDR performs feedback for controlling the phase of the clock signal CLK so that probabilities of occurrence of the Early signal and the Late signal are almost equal to each other, and therefore, for example, when the time width of the TW1 is longer than the time width of the TW2, the phase of the clock CLK is fixed at a position where the phase is too early with respect to an originally-optimum position.

Figure 8A:
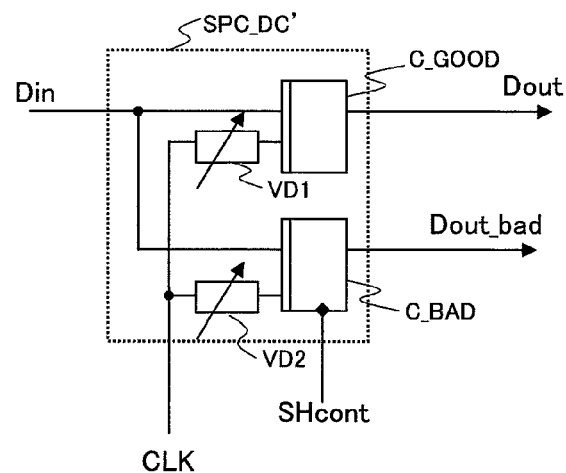
FIG. 8A is a circuit diagram showing a single-phase clock dual data judging unit SPC_DC' (an alternative of SPC_DC of FIG. 5A) adopted in a single-phase clock comparison circuit according to a third embodiment of the present invention.
Figure 8B:
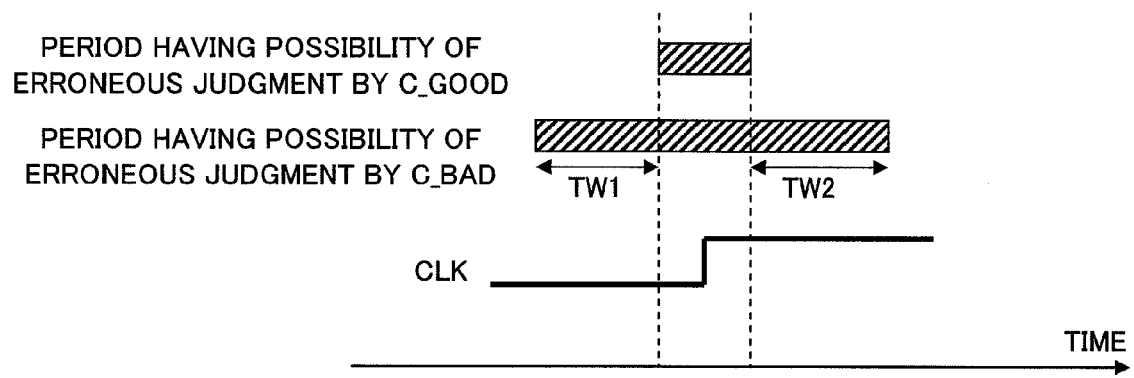
FIG. 8B is a conceptual diagram describing a principle of the single-phase clock dual data judging unit SPC_DC' of FIG. 8A.

In the single-phase clock dual data judging unit SPC_DC shown in FIG. 8A, in order to set the time widths of the previous and subsequent eye track windows TW1 and TW2 to be almost equal to each other, variable delay circuits VD1 and VD2 are inserted in clocks to be inputted to the two data judging units C_GOOD and C_BAD, respectively. Here, when the delay of the variable delay circuit VD1 is increased, the period having the possibility of the erroneous judgment by the C_GOOD of FIG. 8B is delayed, and, as a result, the time width of the previous eye track window TW1 is increased, and the time width of the subsequent eye track window TW2 is decreased. Conversely, when the delay of the variable delay circuit VD2 is increased, the period having the possibility of the erroneous judgment by the C_BAD of FIG. 8B is delayed, and, as a result, the time width of the previous eye track window TW1 is decreased, and the time width of the subsequent eye track window TW2 is increased. Therefore, by adjusting delay amounts of the two variable delay circuits VD1 and VD2, the time widths of the previous and subsequent eye track windows TW1 and TW2 can be adjusted so as to be almost equal to each other.

Here, instead of inserting the two variable delay circuits VD1 and VD2 into clock inputs of the two data judging units C_GOOD and C_BAD, a structure is also possible, in which a fixed delay is inserted prior to the C_GOOD and a balance between the time widths of the TW1 and the TW2 is adjusted by only the variable delay circuit VD2 inserted prior to the C_BAD. Here, it is not always required to explicitly show the fixed delay inserted prior to the C_GOOD on the circuit diagram, and an unavoidable inherent delay of the data judging unit C_GOOD can be also used. Also, instead of inserting the variable delay into the clock, a structure is also considered, in which the variable delay is inputted to the data input inputted to each data judging unit. In this case, for example, when the delay amount inserted into the data input of the C_GOOD is increased, the time width of the previous eye track window TW1 is decreased, and the time width of the subsequent eye track window TW2 is increased.

Here, instead of adjusting the actual lengths of the previous and subsequent eye track windows TW1 and TW2, a structure is also possible, in which the phase of the clock CLK is set at an optimum position by adjusting a ratio of the frequencies of the Early and the Late in a feedback loop of the signal reproduction circuit CDR so as to be a specific different value.

In order to increase the performance of the signal reproduction circuit CDR, in addition to the balance between the time widths of the TW1 and the TW2, it is also required to consider absolute quantities of the time widths of the TW1 and the TW2. Generally, when a jitter amount contained in the data input Din is small, the performance is improved by lengthening the time widths of the TW1 and the TW2, and, when the jitter amount contained in the data input Din is large, the performance is improved by shortening the time widths of the TW1 and the TW2. Here, the jitter amount contained in the data input Din mainly depends on a loss in a wiring which transmits a signal, and therefore, the jitter amount contained in the data input Din varies depending on a situation of usage of a transmitter and a receiver, and thus, it is difficult to previously assume the amount at a designing stage. Therefore, it is desired that the absolute quantities of the time widths of the TW1 and the TW2 can be adjusted in accordance with the situation of usage.

From FIG. 8A, it can be seen that the adjustment of the absolute quantities of the time widths of the TW1 and the TW2 can be achieved by allowing the period having the possibility of the erroneous judgment by the C_BAD to be adjusted. In the single-phase clock dual data judging unit SPC_DC' shown in FIG. 8A, in the clock synchronous data judging unit C_BAD having the long data determination period (as the sum of the required setup time and the required hold time) required for correctly judging the data, that is, having the bad performance, the required data determination period (the required setup time and the required hold time) can be controlled by a control signal SHcont from an outside.

Figure 9A:
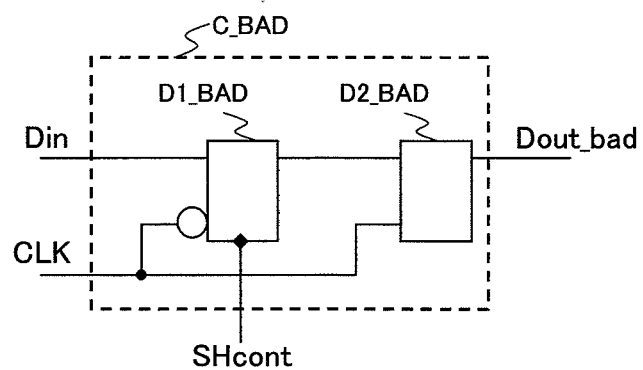
FIG. 9A is a block diagram of a structure example of a data judging unit C_BAD of FIG. 8A.
Figure 9B:
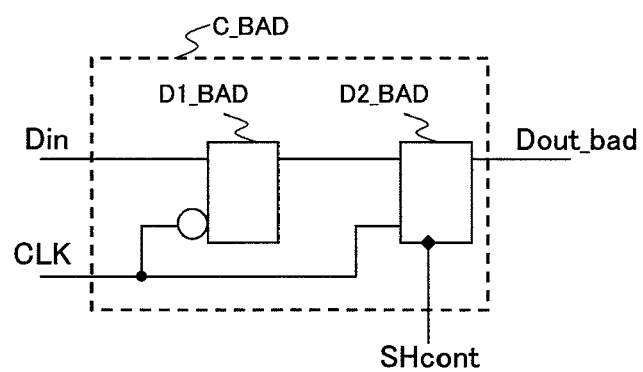
FIG. 9B is a block diagram of another structure example of the data judging unit C_BAD of FIG. 8A.

FIG. 9A shows a structure example of the data judging unit C_BAD of FIG. 8A. Also, FIG. 9B is a diagram showing another structure example of the data judging unit C_BAD. Both of the data judging unit of FIG. 9A and the data judging unit of FIG. 9B include two D-type latch circuits (level trigger latch circuits) D1_BAD and D2_BAD operated in synchronization with clocks CLK with opposite phases to each other to form a D-type flip-flop circuit with a master/slave structure.

In the data judging unit C_BAD shown in FIG. 9A, the control signal SHcont is inputted to the master-side D-type latch circuit (level trigger latch circuit) D1_BAD to allow the data determination period required for a correct data retaining operation by the D1_BAD to be adjusted by the control signal SHcont. As a result, the data determination period (the required setup time and the required hold time) required for the correct data judgment of the entire data judging unit C_BAD can be varied by the control signal SHcont, and the absolute quantities of the time widths of the eye track windows TW1 and TW2 can be adjusted.

In the data judging unit C_BAD shown in FIG. 9B, the control signal SHcont is inputted to the slave-side D-type latch circuit (level trigger latch circuit) D2_BAD to allow the data determination period required for a correct data retaining operation by the D2_BAD to be adjusted by the control signal SHcont. As a result, similarly to FIG. 9A, the data determination period (the required setup time and the required hold time) required for the correct data judgment of the entire data judging unit C_BAD can be varied by the control signal SHcont, and the absolute quantities of the time widths of the eye track windows TW1 and TW2 can be adjusted.

Also, instead of inputting the control signal SHcont only to the master-side D-type latch circuit (level trigger latch circuit) D1_BAD or the slave-side D-type latch circuit (level trigger latch circuit) D2_BAD, a structure is also possible, in which the control signal SHcont is inputted to both of the master-side and slave-side D-type latch circuits (level trigger latch circuits) to simultaneously adjust the data determination periods required for the correct data retaining operations by the two D-type latch circuits (level trigger latch circuits).

Figure 10:
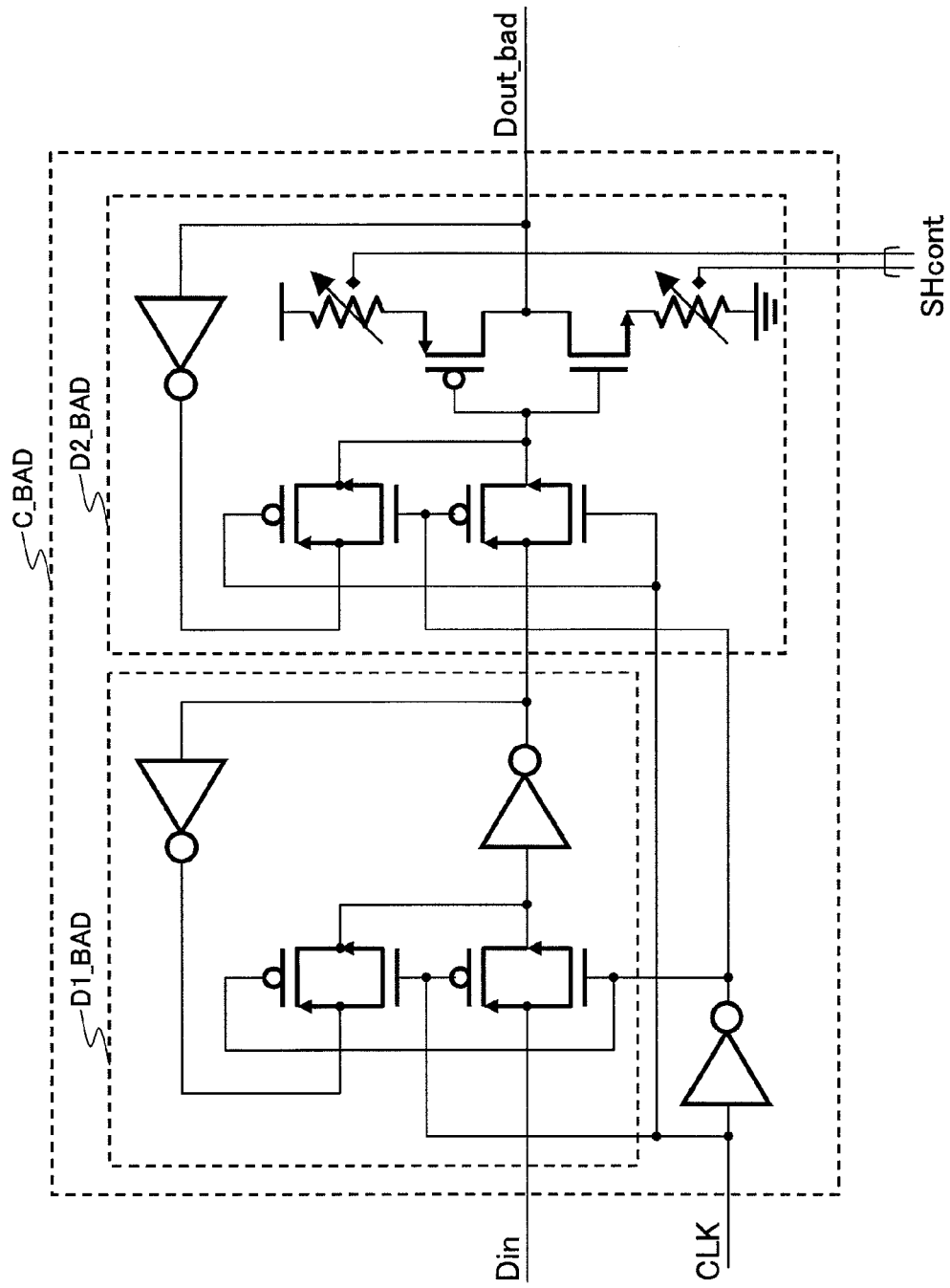
FIG. 10 is a circuit diagram showing a detailed structure of a data judging unit C_BAD of FIG. 9B.

FIG. 10 is a circuit diagram showing a detailed structure example of the data judging unit C_BAD shown in FIG. 9B. The data judging unit C_BAD shown in FIG. 10 is configured with a D-type latch circuit (level trigger latch circuit) with a semi-static structure using a pass transistor which is general in a CMOS circuit. Here, in order to provide a variable data determination period required for a correct data retaining operation by the slave-side D-type latch circuit (level trigger latch circuit), a variable resistor is inserted on a source side of each transistor of a data-judging CMOS inverter provided immediately after the pass transistor. When a resistance value of this variable resistor is increased, a current amount of the CMOS inverter is restricted, and therefore, the sensitivity to the change of the data input is decreased, and the required data determination period is lengthened. Conversely, by decreasing the resistance value of the variable resistor, the current amount of the CMOS inverter is increased, and the required data determination period is shortened. Therefore, by controlling the resistance value of the variable resistor by the control signal SHcont, the required data determination period (the required setup time and the required hold time) of the data judging unit C_BAD can be variable, and the absolute quantities of the time widths of the eye track windows TW1 and TW2 can be adjusted.

In FIG. 10, it is not always required to insert the variable resistance to be inserted in the CMOS inverter on both of an NMOS side and a PMOS side, and a structure in which it is inserted only on the NMOS side or the PMOS side is also possible. In this case, similarly to a data judging unit C_BAD according to a fourth embodiment described later, its operation corresponds to an operation in which an offset is forcibly introduced into the data judging unit C_BAD.

As described above, by using the single-phase clock data judgment/phase comparison circuit according to the third embodiment and the signal reproduction circuit including the single-phase clock data judgment/phase comparison circuit, the balance between the previous and subsequent eye track windows TW1 and TW2 in the phase comparison circuit and the absolute times thereof can be adjusted, and the signal reproduction circuit can be optimally operated in accordance with the state of the transmission path.

Fourth Embodiment

Figure 11:
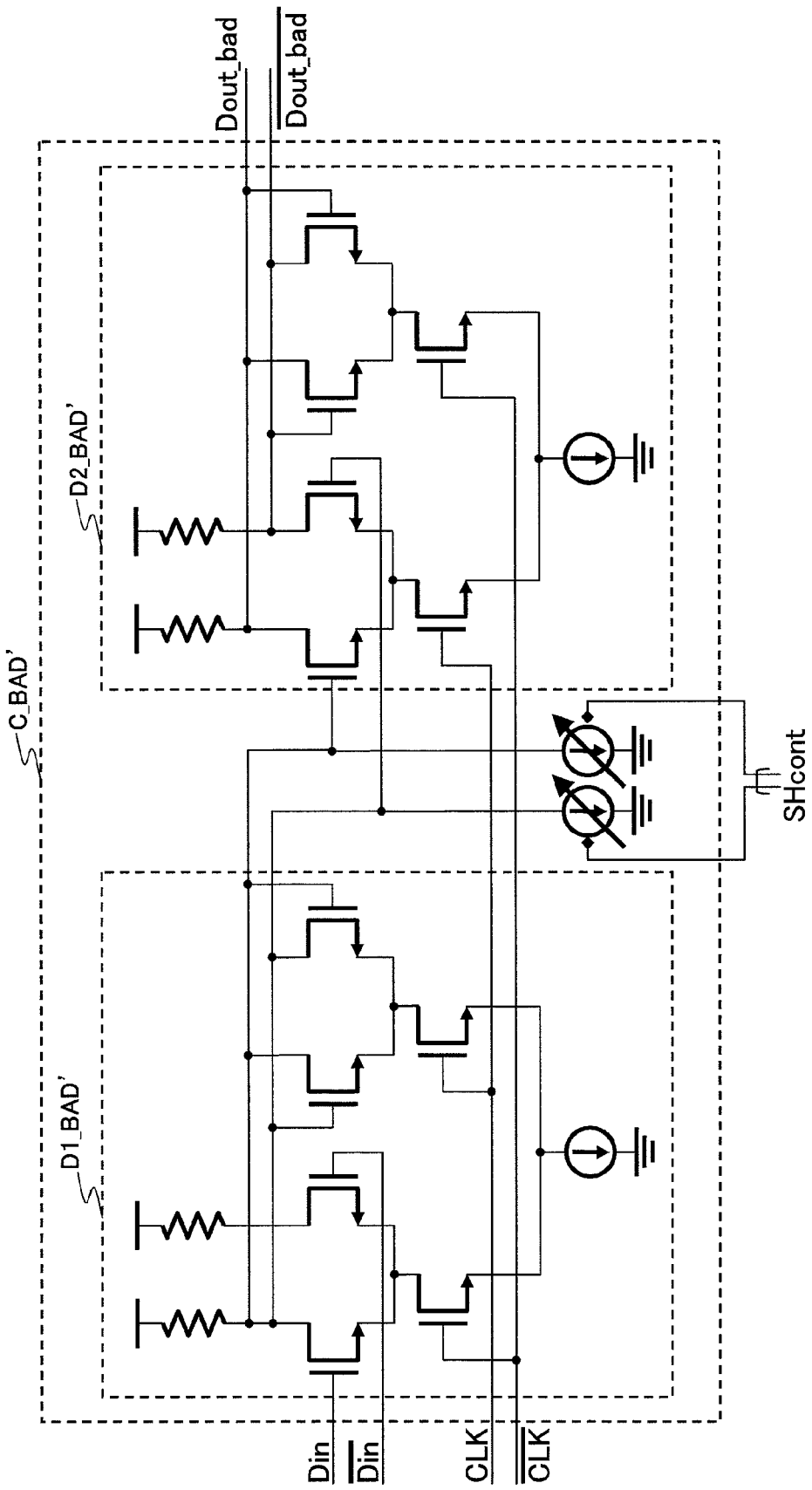
FIG. 11 is a circuit diagram showing a data judging unit C_BAD' (an alternative of the data judging unit C_BAD of FIG. 9B) according to a fourth embodiment of the present invention.

In the fourth embodiment, as the data judging unit C_BAD having the "bad performance" of the single-phase clock dual data judging unit shown in FIG. 8A, a unit shown in FIG. 11 is used. A data judging unit C_BAD' of FIG. 11 includes: D-type latch circuits (level trigger latch circuits) D1_BAD' and D2_BAD' configured with two current mode logic circuits (CML circuits) with a complete- (fully-) differential structure; and two variable current sources arranged between these D-type latch circuits (level trigger latch circuits) D1_BAD' and D2_BAD'. These two variable current sources are similar to circuits generally used for offset adjustment of the current mode logic circuit (CML circuit). By controlling these two variable current sources by the control signal SHcont, the offset can be forcibly introduced into the slave-side D-type latch circuit (level trigger latch circuit) D2_BAD'. By introducing the offset, the data determination period required for correctly judging the data by the data judging unit C_BAD can be equivalently lengthened.

For example, it is assumed that, by introducing the offset, the slave-side D-type latch circuit (level trigger latch circuit) D2_BAD' tends to output "0" rather than "1". At this time, when a case of transition of the data input Din from "0" to "1" is considered, since the D2_BAD' tends to output "0" by introducing the offset, it is required to determine the data input for longer time than that in a state without the offset in order to cause transition of an output Dout_bad of the D2_BAD' from "0" to "1". On the other hand, in a case of transition of the data input Din from "1" to "0", the required determination period of the data input is shorter than that in the state without the offset. However, the required data determination period viewed as the entire data judging unit C_BAD is defined by a data pattern having the longest required data determination period, and therefore, the data determination period required for correctly judging the data by the data judging unit C_BAD' is lengthened by introducing the offset.

As described above, by adjusting an introduced offset amount by the control signal SHcont, the required data determination period (the required setup time and the required hold time) of the data judging unit C_BAD' can be variable, and the absolute quantities of the time widths of the eye track windows TW1 and TW2 can be adjusted.

Here, by not only the method by the variable current sources shown in FIG. 11 but also a publicly-known method such as adding a variable capacitance to each of differential signal lines p and n, the offset can be introduced into the data judging unit C_BAD.

The lengthening of the required data determination period by introducing the offset is similarly effective to the previous and subsequent eye track windows TW1 and TW2, and therefore, there is a merit such that the problem of causing the unbalance between the time widths of the previous and subsequent eye track windows TW1 and TW2, which is described above for the third embodiment, is prevented by introducing the offset.

As described above, by using the single-phase clock data judgment/phase comparison circuit according to the fourth embodiment and the signal reproduction circuit including the single-phase clock data judgment/phase comparison circuit, the absolute times of the previous and subsequent eye track windows TW1 and TW2 in the phase comparator can be adjusted as keeping their balance, and the signal reproduction circuit can be optimally operated in accordance with the state of the transmission path.

Fifth Embodiment

Figure 12:
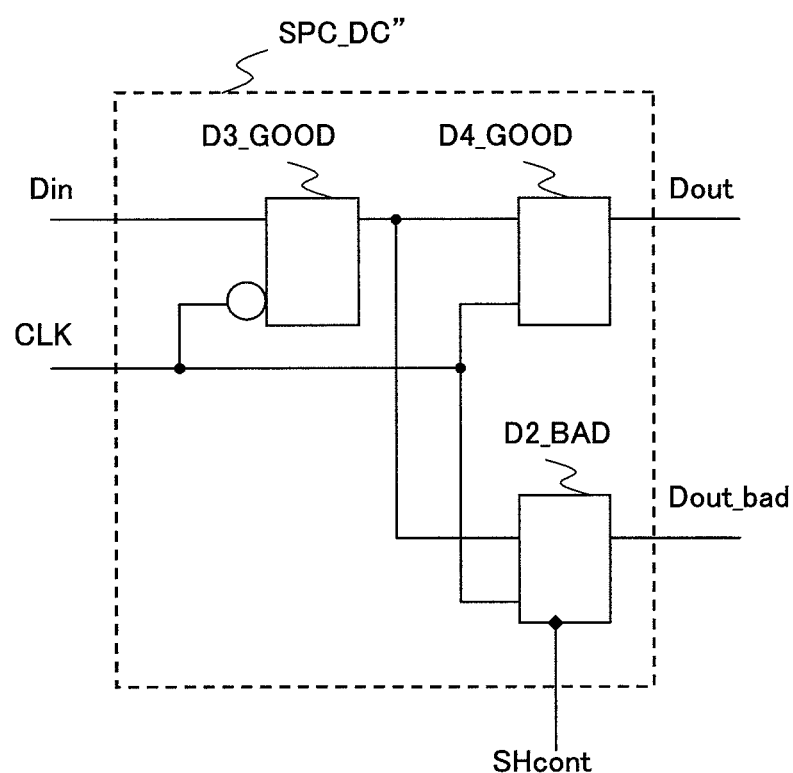
FIG. 12 is a circuit diagram showing a single-phase clock dual data judging unit SPC_DC" (another alternative of SPC_DC of FIG. 5A) according to a fifth embodiment of the present invention.

In a fifth embodiment, from each component of the single-phase clock data judgment/phase comparison circuit SPC_DD/PD according to the first embodiment shown in FIG. 5A, the single-phase clock dual data judging unit SPC_DC is replaced by an SPC_D'' shown in FIG. 12. The single-phase clock dual data judging unit SPC_DC'' of FIG. 12 includes: three D-type latch circuits (level trigger latch circuits) D3_GOOD, D4_GOOD, and D2_BAD. This circuit can be said as that the master-side D-type latch circuit (level trigger latch circuit) is shared by the data judging unit C_GOOD having the good performance and the data judging unit C_BAD having the bad performance in the single-phase clock dual data judging unit SPC_DC shown in FIG. 5A and only the slave-side D-type latch circuit (level trigger latch circuit) is separately used therebetween. By adjusting the data determination period required for correctly retaining the data by the D-type latch circuit (level trigger latch circuit) D2_BAD by the control signal SHcont, the data determination period required for correctly judging the data by the data judging unit C_BAD having the bad performance, that is, the absolute quantities of the time widths of the eye track windows TW1 and TW2 can be adjusted. For this adjustment, the method described in the third embodiment or the method described in the fourth embodiment is applied.

In the fifth embodiment, the master-side D-type latch circuit (level trigger latch circuit) D3_GOOD is shared by the data judging unit C_GOOD having the good performance and the data judging unit C_BAD having the bad performance. Therefore, if the slave-side D-type latch circuit (level trigger latch circuit) D2_BAD of the data judging unit C_BAD having the bad performance is exactly the same with the slave-side D-type latch circuit (level trigger latch circuit) D4_GOOD of the data judging unit C_GOOD having the good performance, the two judging units output exactly the same result. By lengthening, from this state, the data determination period required for correctly retaining the data by the slave-side D-type latch circuit (level trigger latch circuit) D2_BAD of the data judging unit C_BAD having the bad performance by the control signal SHcont, the time widths of the eye track windows TW1 and TW2 can be adjusted to desirable quantities. At this time, by lengthening the data determination period required for correctly retaining the data by the slave-side D-type latch circuit (level trigger latch circuit) D2_BAD of the data judging unit C_BAD having the bad performance by introducing the offset as described in the fourth embodiment, the problem of causing the unbalance between the time widths of the previous and subsequent eye track windows TW1 and TW2, which is described in the third embodiment, is prevented. Therefore, a circuit for adjusting the balance between the time widths of the previous and subsequent eye track windows TW1 and TW2 is unnecessary, and the circuit size and power consumption can be reduced.

As described above, by using the single-phase clock data judgment/phase comparison circuit according to the fifth embodiment and the signal reproduction circuit including the single-phase clock data judgment/phase comparison circuit, and by sharing the master-side D-type latch circuit (level trigger latch circuit) by the two data judging units, the circuit size and power consumption can be reduced, and besides, the absolute times of the previous and subsequent eye track windows TW1 and TW2 in the phase comparator can be adjusted as keeping their balance, and therefore, the signal reproduction circuit can be optimally operated in accordance with the state of the transmission path.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

Optical communication devices according to various embodiments of the present invention are particularly effectively applied to a circuit of a receiving unit in an optical communication system with a communication speed exceeding several tens of Gbps.

SYMBOL EXPLANATION

CDR: signal reproduction circuit
SPC_DD/PD: single-phase clock data judgment/phase comparison circuit
SPC_DC, SPC_DC', and SPC_DC": single-phase clock dual data judging unit
C_GOOD and C_BAD: single-phase clock data judging unit
EL_LOGIC and EL_LOGIC': Early/Late decision logic
DFF1, DFF2, DFF3, and DFF4: D-type flip flop
SR1: shift register
D1_BAD, D2_BAD, D3_GOOD, and D4_GOOD: D-type latch circuit

The invention claimed is:

1. A data judgment/phase comparison circuit to which a data and a single clock signal are inputted and which can perform data judgment and phase comparison, the data judgment/phase comparison circuit comprising:
a first data judging circuit which performs data judgment for the inputted data in synchronization with the clock signal;
a second data judging circuit which performs data judgment for the inputted data in synchronization with the clock signal using a same clock phase as the first data judging circuit; and
a phase comparison logic circuit to which an output of the first data judging circuit and an output of the second data judging circuit are inputted, and which outputs a phase comparison output Early indicating that a clock phase is too early or a phase comparison output Late indicating that the clock phase is too late,
a data input determination period required for correctly judging a data by the second data judging circuit being longer than the data input determination period required for correctly judging a data by the first data judging circuit, said data input determination period being a sum of the required setup time and required hold time,
an output result of the first data judging circuit or a result obtained by delaying the output result being outputted as a data judgment result of the entire data judgment/phase comparison circuit, and
the phase comparison logic circuit having a possibility of outputting the phase comparison output Early or Late only when the output of the first data judging circuit and an output of the second data judging circuit are different from each other.

2. The data judgment/phase comparison circuit according to claim 1, wherein
the phase comparison logic circuit includes: a two-input exclusive-OR circuit to which the output of the first data judging circuit and the output of the second data judging circuit are inputted; and two two-input logical AND circuit whose one input is an output of the two-input exclusive-OR circuit, and
each output of the two two-input logical AND circuit is the phase comparison output Early or Late.

3. The data judgment/phase comparison circuit according to claim 1, wherein,
in the phase comparison logic circuit,
when the output of the first data judging circuit and the output of the second data judging circuit are different from each other, with taking symbols of the different outputs as focus symbols, the phase comparison outputs Early and Late are defined by a combination of outputs at total six symbols including: outputs at three symbols obtained by combining the focus symbol of the first data judging circuit and previous and subsequent symbols to the focus symbol; and outputs at three symbols obtained by combining the focus symbol of the second data judging circuit and previous and subsequent symbols to the focus symbol.

4. The data judgment/phase comparison circuit according to claim 3, wherein,
in the phase comparison logic circuit,
when the output of the first data judging circuit and the output of the second data judging circuit are different from each other and when a present output of the first data judging circuit and an output at one previous symbol to that of the present output of the first data judging circuit are different from each other, the phase comparison output Early is outputted, and
when the output of the first data judging circuit and the output of the second data judging circuit are different from each other and when the present output of the first data judging circuit and an output at one subsequent symbol to that of the present output of the first data judging circuit are different from each other, the phase comparison output Late is outputted.

5. The data judgment/phase comparison circuit according to claim 3, wherein
in the phase comparison logic circuit,
when the output of the first data judging circuit and the output of the second data judging circuit are different from each other at a present symbol, when a present output of the first data judging circuit and an output at one previous symbol to the present symbol of the first data judging circuit are the same with each other, and when the present output of the first data judging circuit and the output at one previous symbol to the present symbol of the first data judging circuit are different from each other, the phase comparison output Early is outputted, and when the output of the first data judging circuit and the output of the second data judging circuit are different from each other at the present symbol, when a present output of the first data judging circuit and an output at one previous symbol to the present symbol of the first data judging circuit are the same with each other, and when the present output of the first data judging circuit and the output at one subsequent symbol to the present symbol of the first data judging circuit are different from each other, the phase comparison output Late is outputted.

6. The data judgment/phase comparison circuit according to claim 1, wherein the data judgment/phase comparison circuit includes means for adjusting either one or both of a ratio between required setup time and required hold time required for correctly judging a data by the first data judging circuit or/and a ratio between required setup time and required hold time required for correctly judging a data by the second data judging circuit.

7. The data judgment/phase comparison circuit according to claim 1, wherein the data judgment/phase comparison circuit includes means for adjusting a data input determination period required for correctly judging a data by the second data judging circuit, said input determination period for correctly judging data being a sum of required setup time and required hold time.

8. The data judgment/phase comparison circuit according to claim 7, wherein the means for adjusting the data input determination period required for correctly judging the data by the second data judging circuit is to add an offset from an outside to an internal node of the second data judging circuit, said data input determination period for correctly judging the data being a sum of the required setup time and required hold time.

9. The data judgment/phase comparison circuit according to claim 1, wherein the first data judging circuit and the second data judging circuit are circuits with master/slave structure, a master-side circuit is shared by the first data judging circuit and the second data judging circuit, and only slave-side circuits are different from each other.

10. The data judgment/phase comparison circuit according to claim 9, wherein the slave-side circuit of the second data judging circuit includes means for adjusting a data input determination period required for correctly judging a data, said data input determination period required for correctly judging a data being a sum of the required setup time and required hold time.

11. The data judgment/phase comparison circuit according to claim 10, wherein the means for adjusting the data input determination period required for correctly judging the data by the slave-side circuit of the second data judging circuit is to add an offset from an outside to an internal node of the slave-side circuit of the second data judging circuit, said data input determination period required for correctly judging the data being a sum of the required setup time and required hold time.

* * * * *